United States Patent
Cha et al.

(10) Patent No.: US 9,552,998 B2
(45) Date of Patent: Jan. 24, 2017

(54) THIN FILM TRANSISTOR, METHOD OF MANUFACTURING THIN FILM TRANSISTOR AND FLAT PANEL DISPLAY HAVING THE THIN FILM TRANSISTOR

(71) Applicant: Samsung Display Co., Ltd., Yongin, Gyeonggi-Do (KR)

(72) Inventors: Myoung-Geun Cha, Yongin (KR); Sang-Ho Park, Yongin (KR); Hyun-Jae Na, Yongin (KR); Yoon-Ho Khang, Yongin (KR); Dae-Ho Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/558,458

(22) Filed: Dec. 2, 2014

(65) Prior Publication Data
US 2015/0206932 A1  Jul. 23, 2015

(30) Foreign Application Priority Data

Jan. 20, 2014  (KR) .................. 10-2014-0006534

(51) Int. Cl.
*H01L 29/08* (2006.01)
*H01L 21/477* (2006.01)
(Continued)

(52) U.S. Cl.
CPC ........... *H01L 21/477* (2013.01); *H01L 27/124* (2013.01); *H01L 27/1225* (2013.01);
(Continued)

(58) Field of Classification Search
CPC ............. H01L 27/3276; H01L 27/3272; H01L 27/3279; H01L 27/1225; H01L 27/1259; H01L 21/443; H01L 21/477; H01L 27/124
(Continued)

(56) References Cited

U.S. PATENT DOCUMENTS 5,731,216 A   3/1998  Holmberg et al.
8,313,980 B2  11/2012 Akimoto
(Continued)

FOREIGN PATENT DOCUMENTS

JP  2000-036603 A  2/2000
JP  2007-220819 A  8/2007

OTHER PUBLICATIONS

Morosawa et al., "35:3: Distinguished Paper: A Novel Self-Aligned Top-Gate Oxide TFT for AM-OLED Displays," Core Device Development Group, Sony Corporation, *SID 11 Digest*, ISSN 0097-966X/11/4201-0479 © 2011, pp. 479-482.

*Primary Examiner* — Reema Patel
*Assistant Examiner* — Syed Gheyas
(74) *Attorney, Agent, or Firm* — Knobbe Martens Olson & Bear LLP

(57) ABSTRACT

A thin film transistor (TFT), method of manufacturing the TFT and a flat panel display having the TFT are disclosed. In one aspect, the TFT comprises a substrate and an active layer formed over the substrate, wherein the active layer is formed of oxide semiconductor, and wherein the active layer includes two opposing sides. The TFT also comprises source and drain regions formed at the opposing sides of the active layer, a first insulating layer formed over the active layer, a gate electrode formed over the active layer, a second insulating layer formed covering the first insulation layer and the gate electrode, and a first conductive layer formed on the source and drain regions and contacting the second insulating layer.

18 Claims, 5 Drawing Sheets

(51) Int. Cl.
*H01L 27/12* (2006.01)
*H01L 29/786* (2006.01)
*H01L 29/45* (2006.01)
*H01L 29/66* (2006.01)
*H01L 27/32* (2006.01)

(52) U.S. Cl.
CPC .......... *H01L 27/1259* (2013.01); *H01L 29/45* (2013.01); *H01L 29/66969* (2013.01); *H01L 29/7869* (2013.01); *H01L 27/3262* (2013.01)

(58) Field of Classification Search
USPC ......................................................... 257/40
See application file for complete search history.

(56) References Cited

U.S. PATENT DOCUMENTS

| | | |
|---|---|---|
| 8,461,594 B2 | 6/2013 | Morosawa et al. |
| 2010/0308324 A1 | 12/2010 | Kim et al. |
| 2011/0248270 A1* | 10/2011 | Fukumoto ............ H01L 29/517 257/59 |
| 2011/0254826 A1* | 10/2011 | Umezaki ................ G09G 3/344 345/212 |
| 2012/0112182 A1 | 5/2012 | Ishii et al. |
| 2012/0119212 A1* | 5/2012 | Endo ................ H01L 29/78618 257/57 |
| 2012/0319183 A1 | 12/2012 | Yamazaki et al. |
| 2013/0087801 A1 | 4/2013 | Kurita |

* cited by examiner

THIN FILM TRANSISTOR, METHOD OF MANUFACTURING THIN FILM TRANSISTOR AND FLAT PANEL DISPLAY HAVING THE THIN FILM TRANSISTOR

RELATED APPLICATIONS

This application claims priority to and the benefit of Korean Patent Application No. 10-2014-0006534, filed on Jan. 20, 2014, in the Korean Intellectual Property Office, the entire contents of which are incorporated herein by reference in their entirety.

BACKGROUND

Field

The described technology generally relates to a thin film transistor (TFT), a method of manufacturing the TFT and a flat panel display device having the TFT.

Description of the Related Technology

A thin film transistor (TFT) is used in various electronic devices including flat panel displays (FPDs), and the like. For example, the TFT can be used as a switching element or driving element in flat panel display devices including liquid crystal displays (LCDs), organic light-emitting diode (OLED) displays, electrophoretic display, and the like.

The TFT includes a gate electrode coupled to a gate line for supplying a scan signal, a source electrode coupled to a data line for supplying a signal to be applied to a pixel electrode, a drain electrode opposite to the source electrode, and a semiconductor layer electrically coupled to the source and drain electrodes.

SUMMARY OF CERTAIN INVENTIVE ASPECTS

On inventive aspect is a thin film transistor (TFT), a method of manufacturing the TFT and a flat panel display device having the TFT, which can improve characteristics of the TFT.

Another aspect is a TFT including: a substrate; an oxide semiconductor positioned on the substrate; source and drain electrodes coupled to the oxide semiconductor, the source and drain electrodes being opposite to each other at both sides of the oxide semiconductor about the oxide semiconductor; a first insulating layer positioned on the oxide semiconductor; a gate electrode positioned on the first insulating layer, the gate electrode being overlapped with the oxide semiconductor; a second insulating layer positioned on the gate electrode; first conductive layers coupled to the second insulating layer, the first conductive layers being respectively positioned on the source and drain electrodes; and a second conductive layer positioned on the first conductive layer, the second conductive layer including an opening through which the second insulating layer is exposed.

The oxide semiconductor can include indium gallium zinc oxide (IGZO).

The first conductive layer can include aluminum (Al).

The second insulating layer can include an aluminum oxide (AlOx) layer.

Another aspect is a method of manufacturing a TFT, the method including: providing a substrate; forming a semiconductor pattern including an oxide semiconductor material on the substrate; forming a first insulating layer and a gate electrode, overlapped with a middle portion of the semiconductor pattern; forming an active layer formed beneath the gate electrode and source and drain electrodes opposite to each other about the active layer by performing a reduction process on the semiconductor pattern not overlapped with the first insulating layer; forming a first conductive layer on the source and drain electrodes; forming a second conductive layer formed on the first conductive layer to expose a portion of the first conductive layer overlapped with the gate electrode; and forming the exposed first conductive layer as a second insulating layer including an insulating material.

The forming of the first insulating layer and the gate electrode can include forming an insulating material layer including an insulating material on the semiconductor pattern; forming the gate electrode on the insulating material layer; forming the first insulating layer by patterning the insulating material layer, using the gate electrode as an etch mask, and exposing a portion of the semiconductor pattern; and doping ions into the exposed semiconductor pattern to have conductivity.

The forming of the second insulating layer can include forming a conductive layer including a conductive material on the substrate having the first conductive layer formed thereon; forming the second conductive layer exposing a portion of the first conductive layer overlapped with the gate electrode by patterning the conductive layer; forming a photosensitive layer pattern on the second conductive layer; and performing a plasma treatment on the substrate having the photosensitive layer pattern formed thereon so that the exposed first conductive layer includes an insulating material.

The forming of the second insulating layer can include forming a conductive layer including a conductive material on the substrate having the first conductive layer formed thereon; forming the second conductive layer exposing a portion of the first conductive layer overlapped with the gate electrode by patterning the conductive layer; forming a photosensitive layer pattern on the second conductive layer; and performing an annealing process on the substrate having the photosensitive layer pattern formed thereon so that the exposed first conductive layer includes an insulating material.

The oxide semiconductor material can include indium gallium zinc oxide (IGZO).

The first conductive layer can include Al.

The second insulating layer can include an aluminum oxide (AlOx) layer.

Another aspect is a flat panel display device, including: a first substrate on which an organic light emitting diode and a TFT are formed, wherein the organic light emitting diode includes a first electrode, an organic emission layer and a second electrode, and the TFT controls an operation of the organic light emitting diode; and a second substrate opposite to the first substrate, wherein the TFT includes: an oxide semiconductor positioned on the first substrate; source and drain electrodes coupled to the oxide semiconductor, the source and drain electrodes being opposite to each other at both sides of the oxide semiconductor about the oxide semiconductor; a first insulating layer positioned on the oxide semiconductor; a gate electrode positioned on the first insulating layer, the gate electrode being overlapped with the oxide semiconductor; a second insulating layer positioned on the gate electrode; first conductive layers coupled to the second insulating layer, the first conductive layers being respectively positioned on the source and drain electrodes; and a second conductive layer positioned on the first conductive layer, the second conductive layer including an opening through which the second insulating layer is exposed.

The oxide semiconductor can include indium gallium zinc oxide (IGZO).

The first conductive layer can include Al.

The second insulating layer can include an AlOx layer.

Another aspect is a flat panel display device, including: a first substrate on which a plurality of pixels are defined by a plurality of gate lines and a plurality of data lines, and TFTs and pixel electrodes are formed, wherein the TFT controls a signal supplied to each pixel, and the pixel electrode is coupled to the TFT; a second substrate opposite to the first substrate; and a liquid crystal layer formed between the first and second substrates, wherein the TFT includes: an oxide semiconductor positioned on the first substrate; source and drain electrodes coupled to the oxide semiconductor, the source and drain electrodes being opposite to each other at both sides of the oxide semiconductor about the oxide semiconductor; a first insulating layer positioned on the oxide semiconductor; a gate electrode positioned on the first insulating layer, the gate electrode being overlapped with the oxide semiconductor; a second insulating layer positioned on the gate electrode; first conductive layers coupled to the second insulating layer, the first conductive layers being respectively positioned on the source and drain electrodes; and a second conductive layer positioned on the first conductive layer, the second conductive layer including an opening through which the second insulating layer is exposed.

The oxide semiconductor can include indium gallium zinc oxide (IGZO).

The first conductive layer can include Al.

The second insulating layer can include an AlOx layer.

Another aspect is a thin film transistor am for a display device, the TFT comprising a substrate, an oxide semiconductor formed over the substrate, source and drain electrodes electrically connected to the oxide semiconductor at both sides of the oxide semiconductor, a first insulating layer formed over the oxide semiconductor, a gate electrode formed over the first insulating layer and at least partially overlapping the oxide semiconductor, a second insulating layer formed over the gate electrode, a first conductive layer formed over the source and drain electrodes and connected to the second insulating layer, and a second conductive layer formed over the first conductive layer.

In the above TFT, the oxide semiconductor includes indium gallium zinc oxide (IGZO).

In the above TFT, the first conductive layer is formed of aluminum (Al).

In the above TFT, the second insulating layer includes an aluminum oxide (AlOx) layer.

Another aspect is a method of manufacturing a TFT, the method comprising providing a substrate, forming a semiconductor pattern formed of an oxide semiconductor material over the substrate, forming a first insulating layer and a gate electrode at least partially overlapping a middle portion of the semiconductor pattern, forming an active layer including two opposing sides by performing a reduction process on the semiconductor pattern so as to form source and drain electrodes at the opposing sides of the active layer, forming a first conductive layer over the source and drain electrodes, forming a second conductive layer formed over the first conductive layer so as to expose a portion of the first conductive layer at least partially overlapping the gate electrode, and forming a second insulating layer over the exposed portion.

In the above method, the forming of the first insulating layer and the gate electrode includes forming an insulating material layer on the semiconductor pattern, forming the gate electrode on the insulating material layer, patterning the insulating material layer using the gate electrode as an etch mask so as to form the first insulating layer, and exposing a portion of the semiconductor pattern, and doping ions into the exposed semiconductor pattern.

In the above method, the forming of the second insulating layer includes forming a conductive layer on the substrate, patterning the conductive layer so as to form the exposed portion, forming a photosensitive layer pattern on the second conductive layer, and performing plasma treatment on the substrate.

In the above method, the forming of the second insulating layer includes forming a conductive layer on the substrate, patterning the conductive layer so as to form the exposed portion, forming a photosensitive layer pattern on the second conductive layer, and performing an annealing process on the substrate.

In the above method, the oxide semiconductor material includes IGZO.

In the above method, the first conductive layer is formed of Al.

In the above method, the second insulating layer includes an aluminum oxide (AlOx) layer.

Another aspect is a flat panel display device, comprising a first substrate and a second substrate opposite to the first substrate. The first substrate includes a plurality of organic light-emitting diodes (OLEDs) and a plurality of thin film transistors (TFTs), wherein the TFT is configured to drive the OLED. The TFT includes an oxide semiconductor formed over the first substrate, source and drain electrodes electrically connected to the oxide semiconductor at both sides of the oxide semiconductor, a first insulating layer formed over the oxide semiconductor, a gate electrode formed over the first insulating layer and at least partially overlapping the oxide semiconductor, a second insulating layer formed over the gate electrode, a first conductive layer formed over the source and drain electrodes and connected to the second insulating layer, and a second conductive layer formed over the first conductive layer.

In the above flat panel display device, the oxide semiconductor includes IGZO.

In the above flat panel display device, the first conductive layer is formed of aluminum (Al).

In the above flat panel display device, the second insulating layer includes an aluminum oxide (AlOx) layer.

Another aspect is a flat panel display device, comprising a first substrate, a second substrate opposite to the first substrate, and a liquid crystal layer formed between the first and second substrates. The first substrate comprises a plurality of pixels, a plurality of gate lines, a plurality of data lines, a plurality of thin film transistors (TFTs), and a plurality of pixel electrodes. Each of the TFTs is configured to control a signal supplied to each corresponding pixel. The pixel electrode is electrically connected to the TFT. The TFT includes an oxide semiconductor formed over the first substrate, source and drain electrodes electrically connected to the oxide semiconductor at both sides of the oxide semiconductor, a first insulating layer formed over the oxide semiconductor, a gate electrode formed over the first insulating layer and at least partially overlapping the oxide semiconductor, a second insulating layer formed over the gate electrode, a first conductive layer formed over the source and drain electrodes and connected to the second insulating layer, and a second conductive layer formed over the first conductive layer.

In the above flat panel display device, the oxide semiconductor includes IGZO.

In the above flat panel display device, the first conductive layer is formed of Al.

In the above flat panel display device, the second insulating layer includes an aluminum oxide (AlOx) layer.

Another aspect is a thin film transistor (TFT) for a display device, the TFT comprising a substrate and an active layer formed over the substrate, wherein the active layer is formed of oxide semiconductor, and wherein the active layer includes two opposing sides. The TFT also comprises source and drain regions formed at the opposing sides of the active layer, a first insulating layer formed over the active layer, a gate electrode formed over the active layer, a second insulating layer formed covering the first insulation layer and the gate electrode, and a first conductive layer formed on the source and drain regions and contacting the second insulating layer.

DETAILED DESCRIPTION OF CERTAIN INVENTIVE EMBODIMENTS

Figure 1A:
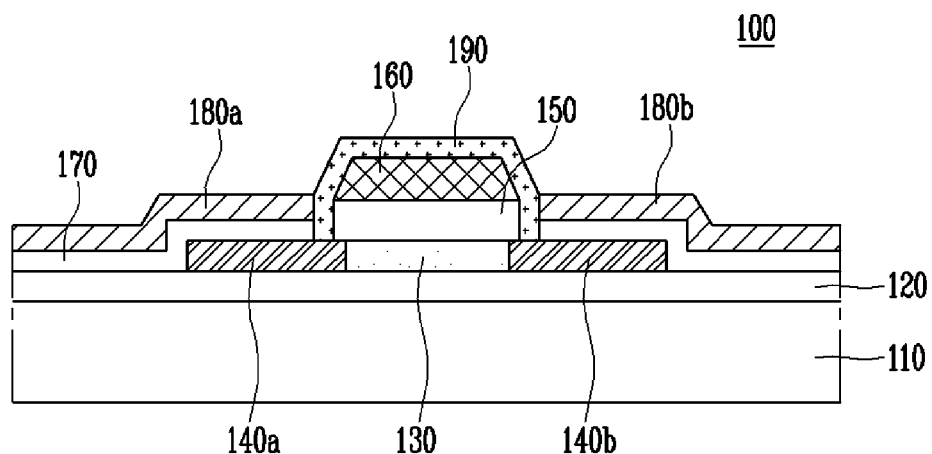
FIG. 1A is a sectional view schematically illustrating an array substrate including a thin film transistor (TFT) according to an embodiment.

The semiconductor layer is an important factor that determines characteristics of the TFT. Silicon (Si) is most frequently used as the semiconductor layer. The silicon used is divided into amorphous silicon and multi-crystalline silicon. The amorphous silicon has a simple manufacturing process but has low electron mobility. Therefore, there is a limitation in the TFT manufactured with amorphous silicon. The multi-crystalline silicon has high electron mobility but requires a process of crystallizing silicon. Therefore, the manufacturing cost and process of the TFT with multi-crystalline silicon are complicated.

In order to supplement the disadvantages of the amorphous silicon and the multi-crystalline silicon, studies have been conducted to develop a TFT using an oxide semiconductor which has high electron mobility and on/off ratio compared to the amorphous silicon, and has cheap unit cost and high uniformity compared to the multi-crystalline silicon.

Hereinafter, certain exemplary embodiments according to the described technology will be described with reference to the accompanying drawings. Here, when a first element is described as being coupled to a second element, the first element can be not only directly coupled to the second element but can also be indirectly coupled to the second element via a third element. Further, some of the elements that are not essential to the complete understanding of the described technology are omitted for clarity. Also, like reference numerals refer to like elements throughout.

In the drawings, the thickness of layers, films and regions are exaggerated for clarity. It will be understood that when an element such as a layer, film, region or substrate is referred to as being "on" another element, it can be directly on the other element or intervening elements can also be present. In contrast, when an element is referred to as being "directly on" another element, there are no intervening elements present.

In this disclosure, the term "substantially" includes the meanings of completely, almost completely or to any significant degree under some applications and in accordance with those skilled in the art.

Figure 1B:
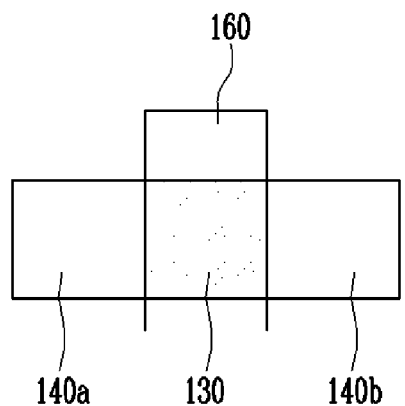
FIG. 1B is a plan view of the array substrate of FIG. 1A.

FIG. 1A is a sectional view schematically illustrating an array substrate including a thin film transistor (TFT) according to an embodiment. FIG. 1B is a plan view of the array substrate of FIG. 1A.

Referring to FIGS. 1A and 1B, the array substrate 100 including the TFT according to this embodiment includes a substrate 110, a buffer layer 120 formed on the substrate 110, an oxide semiconductor layer 130, source electrode 140a and a drain electrode 140b, which are formed on the buffer layer 120. In FIGS. 1A and 1B, the array substrate 100 also includes a first insulating layer 150 formed on the oxide semiconductor layer 130, a gate electrode 160 formed on the first insulating layer 150, and a second insulating layer 190 formed on the gate electrode 160.

The array substrate 100 further includes a first conductive layer 170 formed on the source and drain electrodes 140a and 140b, and second conductive layers 180a and 180b patterned on the first conductive layer 170 except the second insulating layer 190.

The substrate 110 can be formed of a material for forming elements, which has excellent mechanical strength or dimensional stability. Examples of the material of the substrate 110 can be glass, metal, ceramic, plastic (polycarbonate resin, acryl resin, vinyl chloride resin, polyethylene terephthalate resin, polyimide resin, polyester resin, epoxy resin, silicon resin, fluorine resin, etc.), and the like, but the material is not limited thereto.

The buffer layer 120 can be formed of an insulative oxide such as silicon oxide ($SiO_x$), aluminum oxide ($Al_2O_3$), hafnium oxide ($HfO_3$) or yttrium oxide ($Y_2O_3$). The buffer layer 120 can prevent impurities from being diffused into the oxide semiconductor layer 130, which can be subsequently laminated, from the substrate 110, to protect the oxide semiconductor layer 130 and to improve interface characteristics. The buffer layer 120 can be omitted depending on the material of the substrate 110.

The oxide semiconductor layer 130 can include an oxide semiconductor material. The oxide semiconductor material is a metal oxide semiconductor, and can include an oxide of a metal such as zinc (Zn), indium (In), gallium (Ga), tin (Sn) or titanium (Ti), or a combination of the metal such as Zn, In, Ga, Sn or Ti and the oxide thereof. For example, the oxide semiconductor material can include at least one of zinc oxide (ZnO), zinc-tin oxide (ZTO), zinc-indium oxide (ZIO), indium oxide (InO), titanium oxide (TiO), indium-gallium-zinc oxide (IGZO) and indium-zinc-tin oxide (IZTO).

In this embodiment, the oxide semiconductor material includes indium-gallium-zinc oxide (IGZO).

The source and drain electrodes 140a and 140b are formed at both sides of the oxide semiconductor layer 130, and are space apart from each other at a predetermined distance. In addition, the source and drain electrodes 140a and 140b are coupled to the oxide semiconductor layer 130.

The source and drain electrodes 140a and 140b have conductivity, and can be formed of a material identical to the oxide semiconductor material and a reduced semiconductor material.

The first insulating layer 150, for example, can be a single or stacked layer formed of silicon oxide ($SiO_2$), silicon nitride (SiN), silicon oxynitride (SiON), or a combination thereof.

The first insulating layer 150 can improve interface characteristics of the oxide semiconductor layer 130 and prevent impurities from being diffused into the oxide semiconductor layer 130.

The gate electrode 160 can be formed on the first insulating layer 150 overlapping the oxide semiconductor layer 130. In some embodiments, the boundary of a side portion of the gate electrode 160 and the boundary of a side portion of the first insulating layer 150 are substantially aligned to correspond to each other.

In some embodiments, the oxide semiconductor layer 130 is covered by the first insulating layer 150 and the gate electrode 160, which are sequentially formed.

In FIG. 1A, the gate electrode 160 is formed of a metal such as aluminum (Al), silver (Ag), copper (Cu), molybdenum (Mo), chrome (Cr), tantalum (Ta), titanium (Ti), an alloy thereof, or the like. The gate electrode 160 can have a single- or multi-layered structure.

In some embodiments, the source and drain electrodes 140a and 140b do not substantially overlap the gate electrode 160. Therefore, the parasitic capacitance between the gate electrode 160 and the source electrode 140a or that between the gate electrode 160 and the drain electrode 140b can be decreased.

The first conductive layer 170 can be formed on the substrate 110 having the gate electrode 160 formed thereon. The conductive layer 170 can be directly formed on the source and drain electrodes 140a and 140b. In this case, the first conductive layer 170 can be formed of a metal having a low work function, such as silver (Ag), magnesium (Mg), aluminum (Al), platinum (Pt), palladium (Pd), gold (At), nickel (Ni), neodymium (Nd), iridium (Ir), chrome (Cr), lithium (Li), calcium (Ca) or a combination thereof.

In this embodiment, the first conductive layer 170 is formed of aluminum (Al).

In some embodiments, the first conductive layer 170 can decrease the contact resistance of the source and drain electrodes 140a and 140b, thereby improving current characteristics of the TFT.

The second conductive layers 180a and 180b can be formed on the first conductive layer 170, and can be formed of a transparent conductive material. The transparent conductive material can include an oxide-based transparent conductive layer such as indium tin oxide (ITO), indium zinc oxide (IZO), zinc oxide (ZnO) or $In_2O_3$. The second conductive layers 180a and 180b can be patterned to be respectively formed on the source and drain electrodes 140a and 140b.

In some embodiments, the second conductive layers 180a and 180b are respectively patterned on the source and drain electrodes 140a and 140b except where a portion of the first conductive layer 170 corresponding to the gate electrode 160 is exposed.

An oxygen plasma treatment or annealing process can be performed on the exposed portion of the first conductive layer 170, thereby forming an aluminum oxide (AlOx) layer including an insulating material. The aluminum oxide (AlOx) layer can be the second insulating layer 190. The second insulating layer 190 can be formed in the same layer as the first conductive layer 170, and can be coupled to the first conductive layer 170.

The second insulating layer 190 can protect the gate electrode 160 from the outside while surrounding the sides of the gate electrode 160.

In some embodiments, the second conductive layers 180a and 180b can prevent the first conductive layer 170 formed therebeneath from reacting with oxygen when the oxygen plasma treatment or annealing process is performed.

The second conductive layers 180a and 180b can be pixel electrodes that are electrically coupled to the first conductive layer 170 and respectively electrically coupled to the source and drain electrodes 140a and 140b.

In some embodiments, because the second insulating layer 190 protects the gate electrode 160, it is possible to omit a process of forming a separate protection layer on the gate electrode 160.

In some embodiments, because the second conductive layer 180b is electrically coupled to the drain electrode 140b, it is possible to omit a process of forming a contact hole by patterning a protection layer in order to allow drain and pixel electrodes to be contacted with each other.

As described above, in the array substrate 100 according to some embodiments, the source and drain electrodes 140a and 140b are formed of an oxide semiconductor. The first conductive layer 170 formed of aluminum (Al) is formed on the source and drain electrodes 140a and 140b so that it is possible to have a higher driving current by decreasing contact resistance, thereby improving the characteristics of the TFT.

In the array substrate 100 according to some embodiments, a portion of the first conductive layer 170 is formed with the second insulating layer 190. In some embodiments, the drain electrode 140b and the second conductive layer 180b are electrically coupled to each other so that it is possible to omit a process of forming a contact hole, thereby simplifying a manufacturing process.

Hereinafter, a manufacturing method of the array substrate including the TFT according to an embodiment will be described in detail.

FIGS. 2 to 8 are sectional views sequentially illustrating a method of manufacturing the array substrate of FIG. 1A according to an embodiment.

Figure 2:
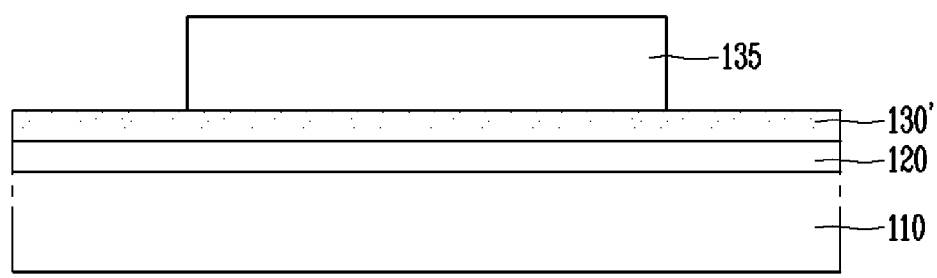
FIGS. 2 to 8 are sectional views sequentially illustrating a method of manufacturing the array substrate of FIG. 1A according to an embodiment.

First, referring to FIG. 2, the buffer layer 120 formed of an insulating material including an oxide such as silicon oxide ($SiO_x$), aluminum oxide ($Al_2O_3$), hafnium oxide ($HfO_3$) or yttrium oxide ($Y_2O_3$) is formed on a substrate 110 that can be formed of glass, plastic or the like. Subsequently, an oxide semiconductor material 130' is formed on a top surface of the substrate 110. In some embodiments, the oxide semiconductor material 130' can be indium-gallium-zinc oxide (IGZO), and the oxide semiconductor material 130' can be annealed so as to have semiconductor characteristics.

A photoresist is applied on the oxide semiconductor material 130' and then exposed, thereby forming a first photosensitive layer pattern 135. The first photoresist layer pattern 135 can be thicker than the oxide semiconductor material 130'.

Figure 3:
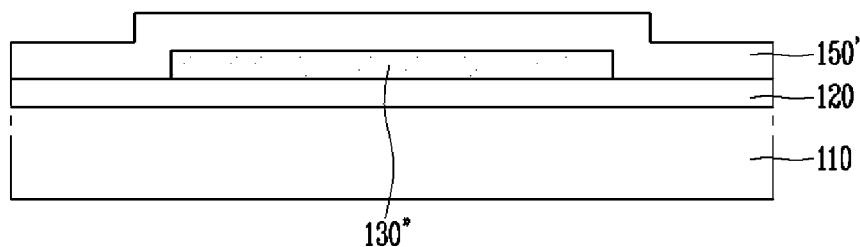

Next, referring to FIG. 3, the oxide semiconductor material 130' is etched using the first photosensitive layer pattern 135 as a mask, thereby forming a semiconductor pattern 130". An insulating material layer 150' is formed on the substrate 110. The insulating material layer 150' can cover the semiconductor pattern 130".

The insulating material layer 150' can be a single layer formed of an insulative oxide such as silicon oxide (SiOx), or multiple layers with a lower layer formed of an insulative material such as silicon oxide (SiOx) and an upper layer formed of an insulating material.

Figure 4:
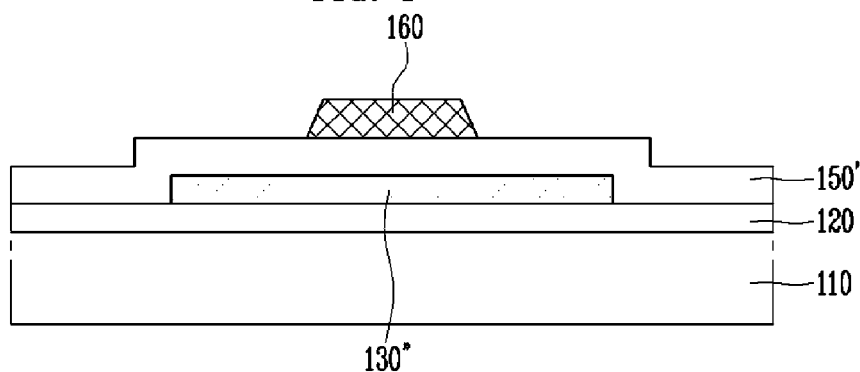

Next, referring to FIG. 4, a conductive material such as metal is laminated and patterned on the substrate 110, thereby forming a gate electrode 160. In some embodiments, the gate electrode 160 is patterned to overlap a middle portion of the semiconductor pattern 130".

Figure 5:
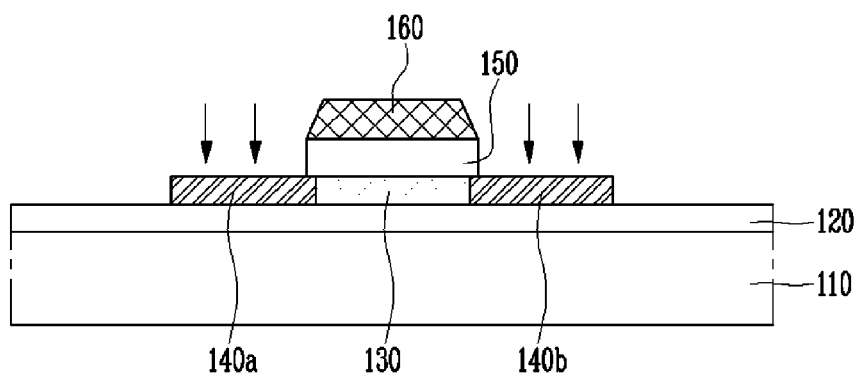

Next, referring to FIG. 5, the insulating material layer 150' is patterned using the gate electrode 160 as an etch mask, thereby forming a first insulating layer 150. The gate electrode 160 and the first insulating layer 150 can have substantially the same width where they contact. The gate electrode 160 can include top and bottom surfaces, where the top surface is shorter than the bottom surface. Through such a process, both side portions of the semiconductor pattern 130", which are not overlapped with the gate electrode 160, are exposed to an outside.

In some embodiments, a dry etching method can be used as the patterning method of the insulating material layer 150', and the buffer layer 120 is not etched by controlling the amounts of etching gas and etching time.

Subsequently, both portions of the semiconductor pattern 130", exposed to the outside, are doped with ions, thereby forming source and drain electrodes 140a and 140b. The portion of the semiconductor pattern 130", overlapped with the gate electrode 160, becomes an oxide semiconductor layer 130 which maintains semiconductor characteristics and performs the function of a channel between the source and drain electrodes 140a and 140b. The width of the oxide semiconductor layer 130 can be less than the width of the first insulating layer 150.

Figure 6:
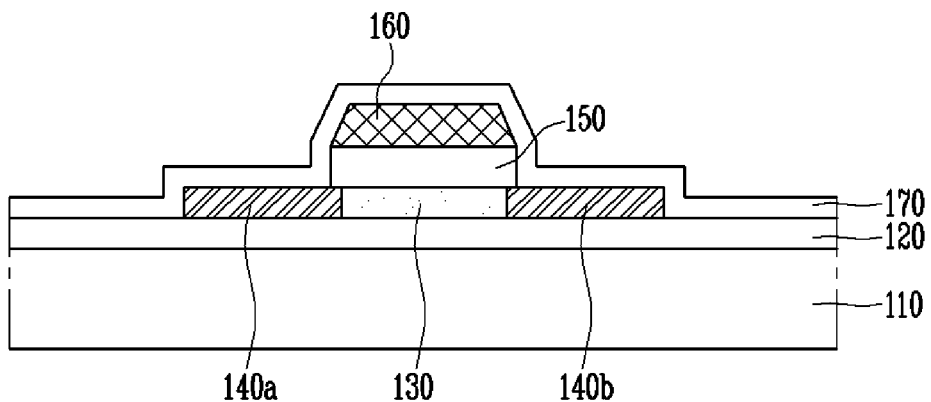

Next, referring to FIG. 6, a first conductive layer 170 formed of metal is formed on the top surface of the substrate 110. The first conductive layer 170 is formed of aluminum (Al) having a low work function. The first conductive layer 170 is formed on the source and drain electrodes 140a and 140b, so that it is possible to decrease contact resistance, thereby improving current characteristics of the TFT. The first conductive layer 170 can be thinner than the gate electrode 160.

Figure 7:
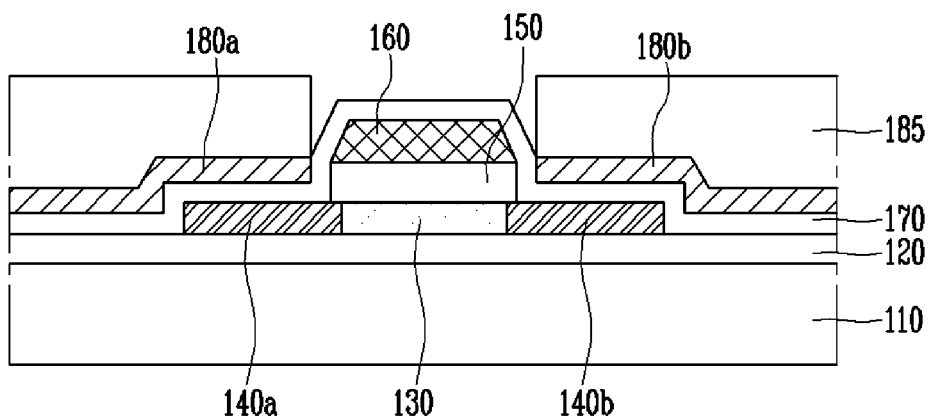

Next, referring to FIG. 7, a conductive material such as metal and a photosensitive layer such as photoresist are sequentially applied on the first conductive layer 170, and a second photosensitive layer pattern 185 is then formed. The second photoresist layer pattern 185 does not overlap the gate electrode 160. The conductive material is patterned using the second photosensitive layer pattern 185 as a mask, thereby forming second conductive layers 180a and 180b having an opening through which a portion of the first conductive layer 170 corresponding to the gate electrode 160 is exposed to the outside. In some embodiments, the exposed portion can become the gate electrode 160.

Figure 8:
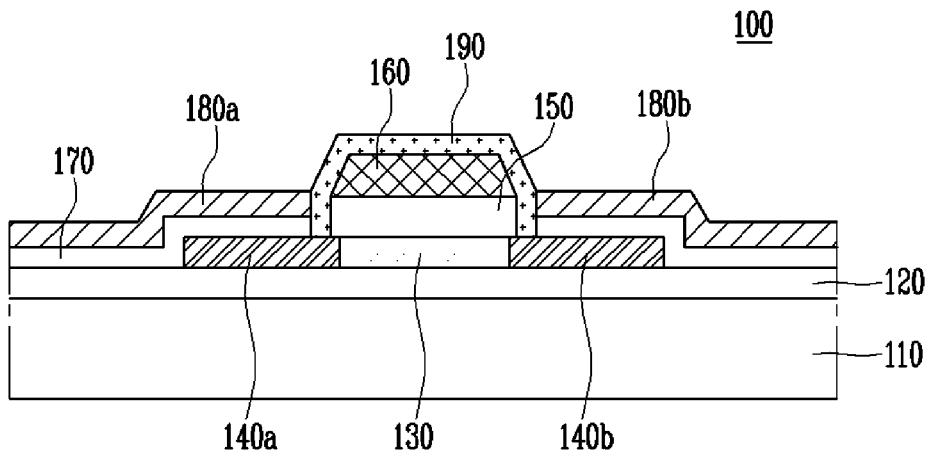

Next, referring to FIG. 8, the second photosensitive layer pattern 185 is removed, and the first conductive layer 170 exposed to the outside reacts with oxygen through a plasma treatment using gas plasma such as oxygen or an annealing process, thereby forming a second insulating layer 190 formed of an insulating material. In some embodiments, the second insulating layer 190 can be formed of an aluminum oxide (AlOx) layer, and surround the sides of the gate electrode 160, thereby protecting the gate electrode 160 and the first insulating layer 150. The thickness of the second insulating layer 190 can be substantially uniform.

In some embodiments, the first conductive layer 170 formed at portions corresponding to the source and drain electrodes 140a and 140b does not react with oxygen because the second conductive layers 180a and 180b formed on the first conductive layer 170 are used as a mask. Therefore, metallic properties are maintained.

In the TFT according to some embodiment, the source and drain electrodes 140a and 140b are formed using an oxide semiconductor, and the first conductive layer 170 is formed on the source and drain electrodes 140a and 140b, thereby allowing high driving current.

In the TFT according to some embodiment, the second insulating layer 190 and the first conductive layer 170 are formed substantially simultaneously. Also, the drain electrode 140b and the second conductive layer 180b are electrically coupled to each other. Therefore, it is possible to omit a process of forming a protection layer and a process of forming a contact hole, thereby simplifying the manufacturing process of the TFT.

Figure 9:
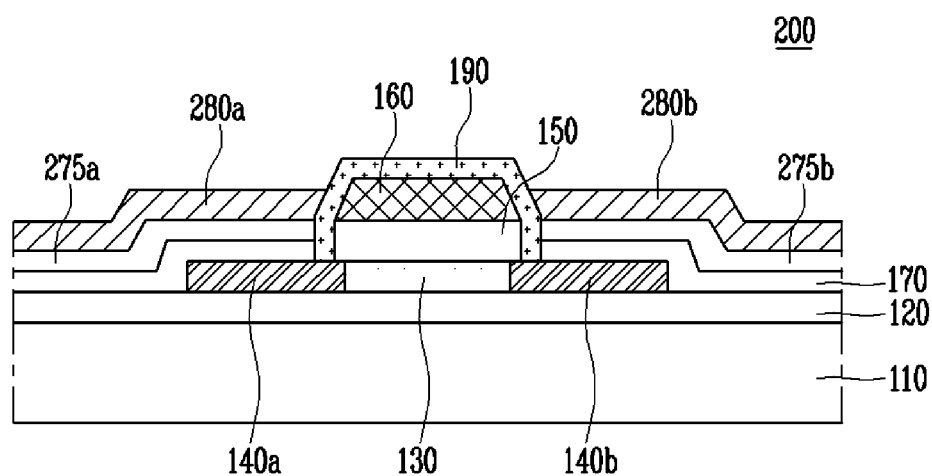
FIG. 9 is a sectional view schematically illustrating an array substrate including a TFT according to another embodiment.

FIG. 9 is a sectional view schematically illustrating an array substrate including a TFT according to another embodiment. Here, components identical to those of the aforementioned embodiment are designated by like reference numerals, and their detailed descriptions will be omitted. Differences between this embodiment and the aforementioned embodiment will be mainly described.

Referring to FIG. 9, an array substrate 200 including the TFT according to this embodiment includes the buffer layer 120 formed on the substrate 110. The array substrate 200 also includes the oxide semiconductor layer 130, the source electrode 140a and the drain electrode 140b, which are formed on the buffer layer 120. Further, the array substrate includes the first insulating layer 150 formed on the oxide semiconductor layer 130, the gate electrode 160 formed on the first insulating layer 150, and the second insulating layer 190 formed on the gate electrode 160.

The array substrate 200 according to this embodiment further includes the first conductive layer 170 formed on the source and drain electrodes 140a and 140b, second conductive layers 275a and 275b formed on the first conductive layer 170, and third conductive layers 280a and 280b respectively formed on the second conductive layers 275a and 275b.

The first conductive layer 170 can be formed of aluminum (Al) among metals having a low work function. The first conductive layer 170 can decrease contact resistance of the source and drain electrodes 140a and 140b formed of an oxide semiconductor having conductivity, thereby improving current characteristics of the TFT.

The third conductive layers 280a and 280b are respectively formed on the second conductive layers 275a and 275b, and can be formed of a transparent conductive material. The transparent conductive material can include indium tin oxide (ITO), indium zinc oxide (IZO), zinc oxide (ZnO) or $In_2O_3$. The third conductive layers 280a and 280b are patterned on the first conductive layer 170 to respectively correspond to the source and drain electrodes 140a and 140b.

When the third conductive layers 280a and 280b are formed on the first conductive layer 170 formed of aluminum (Al) having a low work function, an aluminum oxide (AlOx) layer having an insulating property is formed through a reaction between aluminum (Al) and oxygen ($O_2$) that is a reaction gas in a deposition process. Therefore, the aluminum oxide (AlOx) layer can prevent electrical contact between the first conductive layer 170 and the third conductive layers 280a and 280b.

Accordingly, in order to prevent such a problem, in some embodiments, the second conductive layers 275a and 275b formed of a metal material having a weak bonding force with oxygen ($O_2$) are formed between the first conductive layer 170 and the respective third conductive layers 280a and 280b.

The second conductive layers 275a and 275b can be formed of a metal material including an oxide of titanium (Ti) or zinc (Zn). The second conductive layers 275a and 275b can have a thickness of about 10 to 50 Å in a range where the transparency of the second conductive layers 275a and 275b is not lowered.

Like the third conductive layers 280a and 280b, the second conductive layers 275a and 275b can be patterned on the first conductive layer 170 to respectively correspond to the source and drain electrodes 140a and 140b.

In the TFT according to some embodiments, the source and drain electrodes 140a and 140b are formed of an oxide semiconductor material, and the first conductive layer 170 is formed on the source and drain electrodes 140a and 140b, thereby allowing high driving current.

In the TFT according to some embodiments, the second conductive layers 275a and 275b are formed between the first conductive layer 170 and the respective third conductive layers 280a and 280b, so as to prevent contact resistance between the first conductive layer 170 and the third conductive layers 280a and 280b.

Hereinafter, application examples of a flat panel display device to which the TFT described above is applied will be described.

Figure 10:
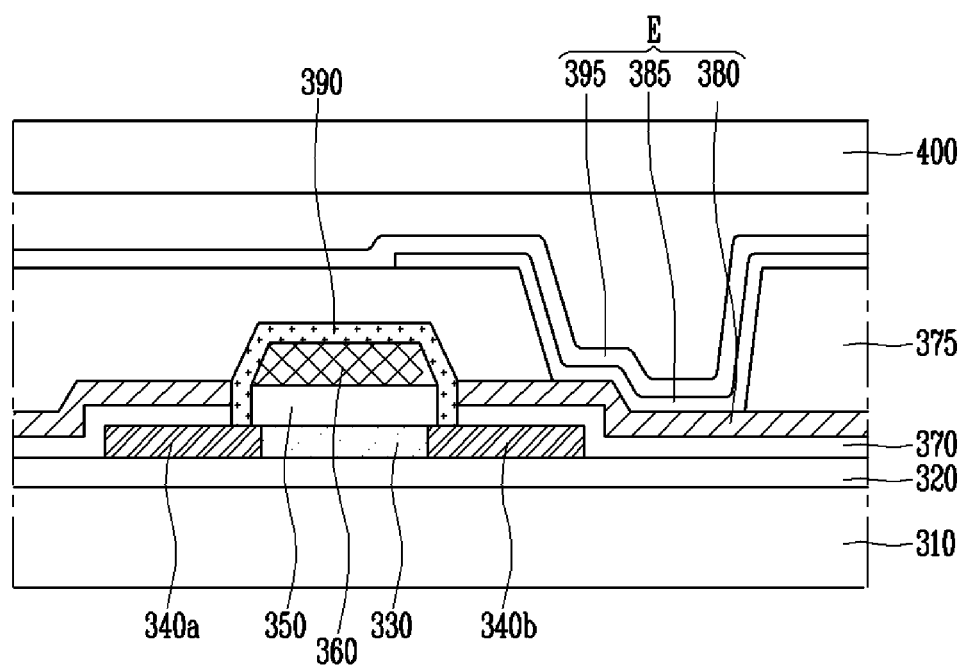
FIG. 10 is a sectional view schematically illustrating an organic light emitting diode (OLED) display including the TFT according to an embodiment.

FIG. 10 is a sectional view schematically illustrating an organic light-emitting diode (OLED) display including the TFT according to an embodiment.

Referring to FIG. 10, the OLED display according to this embodiment includes a buffer layer 320 formed on a first substrate 310. The OLED display also includes an oxide semiconductor layer 330, a source electrode 340a and a drain electrode 340b, which are formed on the buffer layer 320. Further, the OLED display includes a first insulating layer 350 overlapping the oxide semiconductor layer 330, a gate electrode 360 formed on the first insulating layer 350, a second insulating layer 390 formed on the gate electrode 360, a first conductive layer 370 formed on the source and drain electrodes 340a and 340b, and a second conductive layer 380 patterned on the first conductive layer 370 corresponding to a region except the second insulating layer 390.

The OLED display according to this embodiment further includes a pixel defining layer 375 having an opening through which one region of the second conductive layer 380 is exposed on the first substrate 310. The OLED display also includes an organic emission layer 385 formed on the pixel defining layer 375, and a common electrode 395 formed on the pixel defining layer 375 including the organic emission layer 385.

In some embodiments, the second conductive layer 380 becomes a pixel electrode, and the second conductive layer 380, the common electrode 395 and the organic emission layer 385 formed therebetween constitute an OLED.

The diffusion of external oxygen and moisture into the OLED can be prevented by a second substrate 400 which can substantially seal the first substrate 310, using a sealing means (not shown).

The oxide semiconductor layer 330 can be formed an oxide semiconductor material such as indium-gallium-zinc oxide (IGZO).

The source and drain electrodes 340a and 340b are respectively formed at both sides of the oxide semiconductor layer 330. The source and drain electrodes 340a and 340b are spaced apart from each other at a predetermined interval. The source and drain electrodes 340a and 340b are coupled to the oxide semiconductor layer 330.

The source and drain electrodes 340a and 340b can be formed of a material identical to the oxide semiconductor material constituting the oxide semiconductor layer 330 and a reduced semiconductor material.

The gate electrode 360 can be formed on the first insulating layer 350 so as to overlap the oxide semiconductor layer 330.

The first conductive layer 370 can be formed on a top surface of the first substrate 310. In some embodiments, the first conductive layer 370 is directly formed on the source and drain electrodes 340a and 340b.

The first conductive layer 370 formed of aluminum (Al) can decrease contact resistance of the source and drain electrodes 340a and 340b, thereby improving current characteristics of the TFT.

The oxide semiconductor layer 330, the source and drain electrodes 340a and 340b and the gate electrode 360 can be a TFT of a top-gate type structure in the OLED display.

The second conductive layer 380 can be formed on the first conductive layer 370, and can be formed of a transparent conductive material. The transparent conductive material can include indium tin oxide (ITO), indium zinc oxide (IZO), zinc oxide (ZnO) or $In_2O_3$. The second conductive layer 380 can be a pixel electrode which is electrically coupled to the first conductive layer 370 and electrically coupled to the source and drain electrodes 340a and 340b.

In some embodiments, a portion of the first conductive layer 370 is exposed to an outside by patterning the second conductive layer 380. In this embodiment, an oxygen plasma treatment or annealing process is performed on the exposed first conductive layer 370, thereby forming an aluminum oxide (AlOx) layer including an insulating material. The aluminum oxide (AlOx) layer becomes the second insulating layer 390. The second insulating layer 390 is formed in the same layer as the first conductive layer 370, and can be coupled to the first conductive layer 370.

The second insulating layer 390 can protect the gate electrode 360 from the outside.

The organic emission layer 385 and the common electrode 395 are formed on the second conductive layer 380 electrically coupled to the drain electrode 380b, thereby forming the OLED. Accordingly, the OLED can emit light with luminance, corresponding to the driving current supplied from the TFT.

Figure 11:
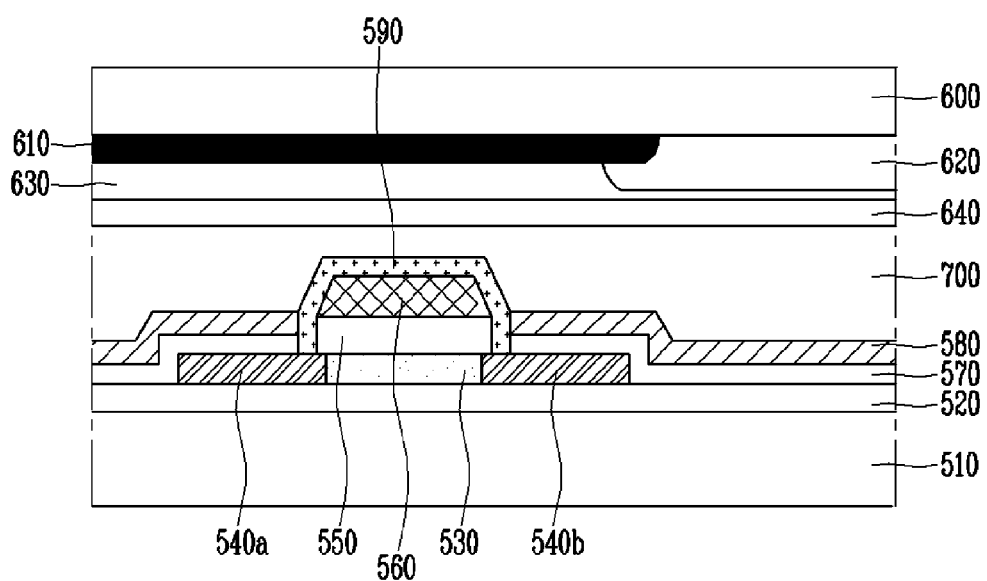
FIG. 11 is a sectional view schematically illustrating a liquid crystal display (LCD) including the TFT according to an embodiment.

FIG. 11 is a sectional view schematically illustrating a liquid crystal display (LCD) including the TFT according to an embodiment.

Referring to FIG. 11, the LCD including the TFT according to this embodiment includes a TFT substrate 510, a color filter substrate 600, and a liquid crystal layer 700 formed between the two substrates 510 and 600.

The TFT substrate 510 includes a buffer layer 520. The TFT substrate 510 also includes an oxide semiconductor layer 530, a source electrode 540a and a drain electrode 540b, which are formed on the buffer layer 520. Further, the TFT substrate 510 includes a first insulating layer 550 overlapping the oxide semiconductor layer 530, a gate electrode 560 formed on the first insulating layer 550, a second insulating layer 590 formed on the gate electrode 560, a first conductive layer 570 formed on the source and drain electrodes 540a and 540b, and a second conductive layer 580 patterned on the first conductive layer 570 to corresponding to the region except the second insulating layer 590.

The oxide semiconductor layer 530 is formed of an oxide semiconductor material such as indium-gallium-zinc oxide (IGZO).

The source and drain electrodes 540a and 540b are respectively formed at both sides of the oxide semiconductor layer 530. The source and drain electrodes 540a and 540b are spaced apart from each other at a predetermined interval. The source and drain electrodes 540a and 540b have conductivity, and can be formed of a material identical to the oxide semiconductor material constituting the oxide semiconductor layer 530 and a reduced semiconductor material.

The first conductive layer 570 can be formed of aluminum (Al), and are directly formed on the source and drain electrodes 540a and 540b.

In some embodiments, the first conductive layer 570 formed of aluminum (Al) can decrease the contact resistance of the source and drain electrodes 540a and 540b, thereby improving current characteristics of the TFT.

The oxide semiconductor layer 530, the source and drain electrodes 540a and 540b and the gate electrode 560 can be a TFT of a top-gate type structure in the LCD.

The second conductive layer 580 is formed on the first conductive layer 570, and can be formed of a transparent conductive material. The transparent conductive material can include indium tin oxide (ITO), indium zinc oxide (IZO), zinc oxide (ZnO) or $In_2O_3$. The second conductive layer 580 can be a pixel electrode which is electrically coupled to the first conductive layer 570 and electrically coupled to the source and drain electrodes 540a and 540b.

In some embodiments, a portion of the first conductive layer 570 is exposed to an outside by patterning the second conductive layer 580. In some embodiments, an oxygen plasma treatment or annealing process is performed on the exposed first conductive layer 570, thereby forming an aluminum oxide (AlOx) layer formed of an insulating material. The aluminum oxide (AlOx) layer becomes the second insulating layer 590. The second insulating layer 590 is formed in the same layer as the first conductive layer 570, and can be coupled to the first conductive layer 570.

The second insulating layer 590 performs the function of a protection layer for protecting the gate electrode 560 from the outside.

The color filter substrate 600 includes a black matrix 610, a color filter 620, a planarization layer 630 and a common electrode 640, which are sequentially formed.

The second conductive layer 580 can be the pixel electrode and charge a pixel signal supplied from the drain electrode 540b of the TFT, thereby generating a potential difference between the second conductive layer 580 and the common electrode 640. The liquid crystal layer 700 formed between the two substrates 510 and 600 can be rotated by dielectric anisotropy caused by the potential difference, and allow light incident from a light source (not shown) to be transmitted toward the color filter substrate 600 by controlling the amount of the light.

In the TFT of the top-gate type structure, a high driving current ability can be secured using a method of forming a portion of an oxide semiconductor having zinc oxide as a main component as source and drain electrodes having low resistance.

In order to form the source and drain electrodes using the oxide semiconductor, it is important to allow the oxide semiconductor to have conductivity through doping of sufficient ions or extraction of indium (In) particles.

In this process, as the degree conductivity of the oxide semiconductor increases beyond the predetermined level of contact resistance, the oxide semiconductor does not perform the function of the source and drain electrodes, and therefore, the characteristics of the TFT can degrade.

In the oxide semiconductor, the film quality is easily degraded due to separation of oxygen, mixture of hydrogen, etc. Hence, the turn-on voltage in the TFT is shifted to negative, and current-voltage characteristics, etc. are degraded. Therefore, the characteristics of the TFT can deteriorate.

According some embodiments, the source and drain electrodes are formed using an oxide semiconductor, so that it is possible to decrease contact resistance, thereby improving characteristics of the TFT.

Further, the pixel electrode is directly formed on the drain electrode, thereby simplifying a manufacturing process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment can be used singly or in combination with features, characteristics, and/or elements described in connection with other embodiments unless otherwise specifically indicated. Accordingly, it will be understood by those of skill in the art that various changes in form and details can be made without departing from the spirit and scope of the inventive technology as set forth in the following claims.

What is claimed is:

1. A thin film transistor (TFT) for a display device, the TFT comprising:
   a substrate;
   an oxide semiconductor formed over the substrate;
   source and drain electrodes electrically connected to the oxide semiconductor at both sides of the oxide semiconductor;
   a first insulating layer formed over the oxide semiconductor;
   a gate electrode formed over the first insulating layer and at least partially overlapping the oxide semiconductor;
   a second insulating layer formed over the gate electrode;
   a first conductive layer formed over the source and drain electrodes; and
   a second conductive layer formed over the first conductive layer,
   wherein the second insulating layer is integrally formed with the first conductive layer in an inseparable body, wherein the second insulating layer covers sides of the gate electrode and the first insulating layer, wherein the second insulating layer contacts the source and drain electrodes, and wherein edges of the second insulating layer are disposed between the first conductive layer and the first insulating layer.

2. The TFT of claim 1, wherein the oxide semiconductor includes indium gallium zinc oxide (IGZO).

3. The TFT of claim 1, wherein the first conductive layer is formed of aluminum (Al).

4. The TFT of claim 1, wherein the second insulating layer includes an aluminum oxide (AlOx) layer.

5. The TFT of claim 1, wherein the second insulating layer comprises an oxide of a material of the first conductive layer.

6. The TFT of claim 1, wherein the second conductive layer comprises an oxide-based transparent conductive layer including at least one of indium tin oxide (ITO), indium zinc oxide (IZO), zinc oxide (ZnO) and In2O3.

7. The TFT of claim 1, further comprising a third conductive layer between the first and second conductive layers, the third conductive layer having a weaker bonding force with oxygen than the second conductive layer.

8. The TFT of claim 7, wherein the third conductive layer comprises an oxide of one of titanium (Ti) and zinc (Zn).

9. The TFT of claim 7, wherein a thickness of the third conductive layer is about 10 Å to about 50 Å.

10. The TFT of claim 1, wherein the second insulating layer has a height greater than that of the second conductive layer.

11. The TFT of claim 1, wherein the second insulating layer has a height greater than a combined height of the first and second conductive layers.

12. The TFT of claim 1, wherein the second conductive layer has a top surface that is closer to the substrate than a top surface of the gate electrode.

13. A thin film transistor (TFT) for a display device, the TFT comprising:
    a substrate;
    an active layer formed over the substrate, wherein the active layer is formed of oxide semiconductor, and wherein the active layer includes two opposing sides;
    source and drain regions formed at the opposing sides of the active layer;
    a first insulating layer formed over the active layer;
    a gate electrode formed over the active layer;
    a second insulating layer formed covering the first insulation layer and the gate electrode;
    a first conductive layer formed on the source and drain regions; and
    a second conductive layer formed over the first conductive layer,
    wherein the second insulating layer is integrally formed with the first conductive layer in an inseparable body, wherein the second insulating layer covers sides of the gate electrode and the first insulating layer, wherein the second insulating layer contacts the source and drain electrodes and wherein edges of the second insulating layer are disposed between the first conductive layer and the first insulating layer.

14. The TFT of claim 13, wherein the second insulating layer comprises an oxide of material of the first conductive layer.

15. The TFT of claim 13, wherein the second conductive layer comprises an oxide-based transparent conductive layer including at least one of indium tin oxide (ITO), indium zinc oxide (IZO), zinc oxide (ZnO) and In2O3.

16. The TFT of claim 13, further comprising a third conductive layer between the first and second conductive layers, a bonding force between the third conductive layer and oxygen being weaker than a bonding force between the second conductive layer and oxygen.

17. The TFT of claim 16, wherein the third conductive layer comprises an oxide of one of titanium (Ti) or zinc (Zn).

18. The TFT of claim 16, wherein a thickness of the third conductive layer is about 10 Å to about 50 Å.

* * * * *